United States Patent
Hong et al.

(10) Patent No.: US 9,917,223 B2
(45) Date of Patent: Mar. 13, 2018

(54) SOLAR CELL PANEL

(71) Applicant: LG ELECTRONICS INC., Seoul (KR)

(72) Inventors: Jongkyoung Hong, Seoul (KR); Minpyo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/857,581

(22) Filed: Sep. 17, 2015

(65) Prior Publication Data

US 2016/0005904 A1    Jan. 7, 2016

Related U.S. Application Data

(63) Continuation of application No. 12/941,660, filed on Nov. 8, 2010, now Pat. No. 9,148,961.

(30) Foreign Application Priority Data

Aug. 11, 2010 (KR) .......................... 10-2010-0077173

(51) Int. Cl.
*H01L 31/042* (2014.01)
*H01L 31/05* (2014.01)
(Continued)

(52) U.S. Cl.
CPC .... *H01L 31/0508* (2013.01); *H01L 31/02168* (2013.01); *H01L 31/022433* (2013.01);
(Continued)

(58) Field of Classification Search
CPC ............. H01L 31/0508; H01L 31/0547; H01L 31/022433; Y02E 10/52
See application file for complete search history.

(56) References Cited

U.S. PATENT DOCUMENTS 4,649,088 A    3/1987  Mitsui et al.
2007/0186968 A1    8/2007  Nakauchi et al.
(Continued)

FOREIGN PATENT DOCUMENTS

CN    101523617 A    9/2009
EP    2 068 372 A1    6/2009
(Continued)

OTHER PUBLICATIONS

Gangopadhyay et al., Front Grid Design for Plated Contact Solar Cells, IEEE 2002, 399-402.*

*Primary Examiner* — Shannon Gardner

(74) *Attorney, Agent, or Firm* — Birch, Stewart, Kolasch & Birch, LLP

(57) ABSTRACT

A solar cell panel is discussed. The solar cell panel includes a plurality of solar cells each including a substrate and an electrode part positioned on a surface of the substrate, an interconnector for electrically connecting at least one of the plurality of solar cells to another of the plurality of solar cells, and a conductive adhesive film including a resin and a plurality of conductive particles dispersed in the resin. The conductive adhesive film is positioned between the electrode part of the at least one of the plurality of solar cells and the interconnector to electrically connect the electrode part of the at least one of the plurality of solar cells to the interconnector. A width of the interconnector is equal to or greater than a width of the conductive adhesive film.

18 Claims, 11 Drawing Sheets

(51) Int. Cl.
    *H01L 31/048*     (2014.01)
    *H05K 3/32*     (2006.01)
    *H01L 31/0224*     (2006.01)
    *H01L 31/054*     (2014.01)
    *H01L 31/0216*     (2014.01)

(52) U.S. Cl.
    CPC ........ *H01L 31/048* (2013.01); *H01L 31/0512* (2013.01); *H01L 31/0547* (2014.12); *H05K 3/323* (2013.01); *H05K 2201/10143* (2013.01); *Y02E 10/52* (2013.01)

(56) References Cited

U.S. PATENT DOCUMENTS

| | | |
|---|---|---|
| 2007/0235077 A1 | 10/2007 | Nagata et al. |
| 2008/0000519 A1 | 1/2008 | Takahashi |
| 2008/0023069 A1 | 1/2008 | Terada et al. |
| 2008/0121265 A1* | 5/2008 | Hishida ........... H01L 31/022425 136/244 |
| 2009/0038675 A1 | 2/2009 | Tsunomura et al. |
| 2011/0048526 A1 | 3/2011 | Ishida et al. |

FOREIGN PATENT DOCUMENTS

| | | | |
|---|---|---|---|
| JP | 8-298334 A | 11/1996 | |
| JP | 9-283785 A | 10/1997 | |
| JP | 2004-140024 A | 5/2004 | |
| JP | 2009-99574 A | 5/2009 | |
| JP | 2009-147050 A | 7/2009 | |
| WO | WO 2009099179 A1 * | 8/2009 | ..... H01L 31/022433 |
| WO | 2009/130949 A1 | 10/2009 | |

\* cited by examiner

SOLAR CELL PANEL

This application is a continuation of application Ser. No. 12/941,660 filed on Nov. 8, 2010, which claims priority to and the benefit of Korean Patent Application No. 10-2010-0077173 filed in the Korean Intellectual Property Office on Aug. 11, 2010. The entire contents of all these applications are incorporated herein by reference.

BACKGROUND OF THE INVENTION

Field of the Invention

Example embodiments of the invention relate to a solar cell panel in which adjacent solar cells are electrically connected to one another using an interconnector.

Description of the Related Art

Solar power generation to convert light energy into electric energy using a photoelectric transformation effect has been widely used as a method for obtaining eco-friendly energy. A solar power generation system using a plurality of solar cell panels has been installed in places, such as houses due to an improvement in a photoelectric transformation efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

SUMMARY OF THE INVENTION

In one aspect, there is a solar cell panel including a plurality of solar cells each including a substrate and an electrode part positioned on a surface of the substrate, an interconnector configured to electrically connect at least one of the plurality of solar cells to another of the plurality of solar cells, and a conductive adhesive film including a resin and a plurality of conductive particles dispersed in the resin, the conductive adhesive film being positioned between the electrode part of the at least one of the plurality of solar cells and the interconnector to electrically connect the electrode part of the at least one of the plurality of solar cells to the interconnector, wherein a width of the interconnector is equal to or greater than a width of the conductive adhesive film.

The electrode part includes a plurality of front electrodes positioned on the surface of the substrate. The interconnector and the conductive adhesive film are positioned in a direction crossing the plurality of front electrodes. In this instance, the width of the interconnector may be equal to or less than about 1.5 times the width of the conductive adhesive film.

The electrode part includes a plurality of front electrodes positioned on the surface of the substrate and a plurality of front electrode current collectors that are positioned on the surface of the substrate to cross the plurality of front electrodes. The interconnector and the conductive adhesive film are positioned in a direction parallel to the plurality of front electrode current collectors.

The width of the interconnector may be equal to or greater than a width of one front electrode current collector.

The width of the interconnector, the width of the conductive adhesive film, and the width of the one front electrode current collector may be substantially equal to one another. The width of the one front electrode current collector may be equal to or less than about 2 mm.

The width of the interconnector may be substantially equal to the width of the conductive adhesive film, and the width of the conductive adhesive film may be greater than the width of the one front electrode current collector. In this instance, the width of the interconnector and the width of the conductive adhesive film are equal to or less than about 1.5 times the width of the one front electrode current collector. Further, a portion of the conductive adhesive film is attached to a portion of a side surface of the one front electrode current collector at a predetermined distance from the surface of the substrate. The predetermined distance may be equal to or greater than about 0.1 times a thickness of the one front electrode current collector. The width of the one front electrode current collector may be equal to or less than about 2 mm.

The width of the interconnector may be greater than the width of the conductive adhesive film, and the width of the conductive adhesive film may be substantially equal to the width of the one front electrode current collector. In this instance, the width of the interconnector may be equal to or less than about 1.5 times the width of the conductive adhesive film and the width of the one front electrode current collector. The width of the one front electrode current collector may be equal to or less than about 2 mm.

The width of the interconnector may be greater than the width of the conductive adhesive film, and the width of the conductive adhesive film may be greater than the width of the one front electrode current collector. In this instance, the width of the interconnector may be equal to or less than about 1.5 times the width of the conductive adhesive film and the width of the one front electrode current collector. A portion of the conductive adhesive film may be attached to a portion of a side surface of the one front electrode current collector at a predetermined distance from the surface of the substrate. The predetermined distance may be equal to or greater than about 0.1 times a thickness of the one front electrode current collector. The width of the one front electrode current collector may be equal to or less than about 2 mm.

The width of the interconnector may be substantially equal to the width of the one front electrode current collector, and the width of the interconnector and the width of the front electrode current collector may be greater than the width of the conductive adhesive film. In this instance, the width of the interconnector and the width of the one front electrode current collector may be equal to or less than about 1.5 times the width of the conductive adhesive film. The width of the one front electrode current collector may be equal to or less than about 2 mm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
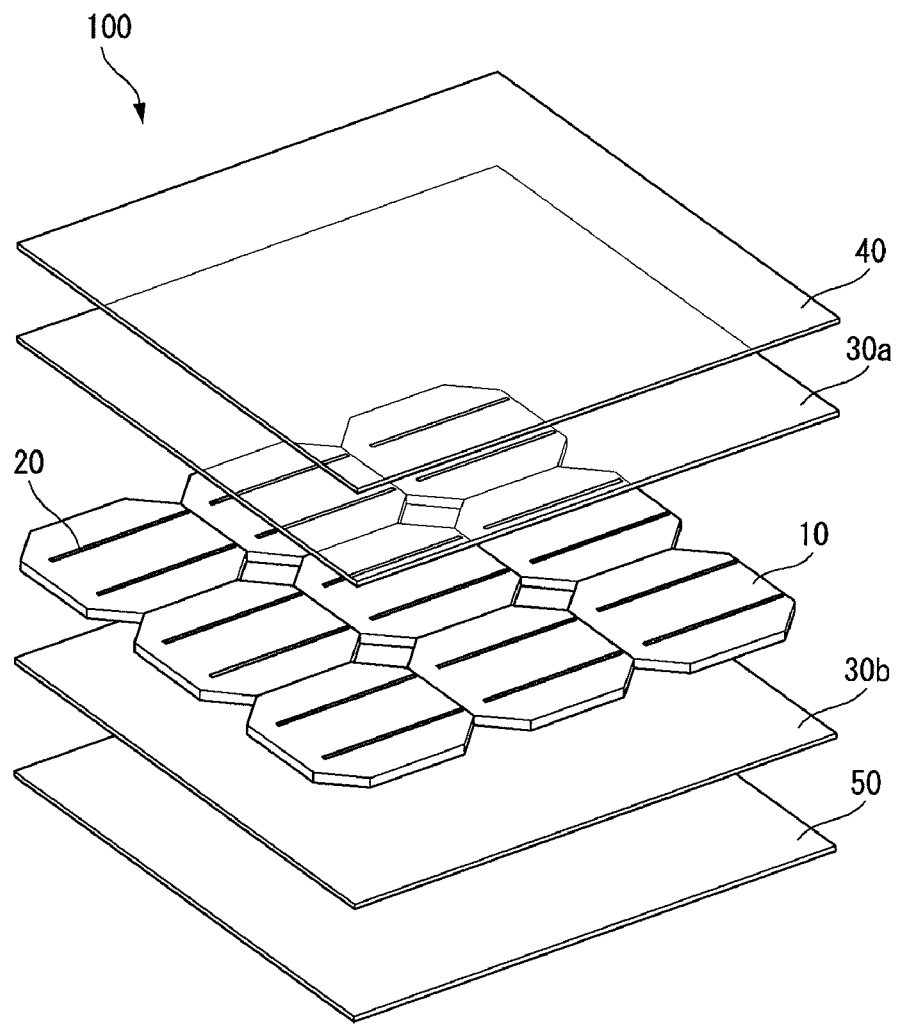
FIG. 1 is an exploded perspective view of a solar cell panel according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is an exploded perspective view of a solar cell panel according to an example embodiment of the invention. As shown in FIG. 1, a solar cell panel 100 according to an example embodiment of the invention includes a plurality of solar cells 10, interconnectors 20 for electrically connecting the solar cells 10 to one another, front and back protective layers 30a and 30b for protecting the solar cells 10, a transparent member 40 positioned on the front protective layer 30a on light receiving surfaces of the solar cells 10, and a back sheet 50 underlying the back protective layer 30b on surfaces opposite the light receiving surfaces of the solar cells 10.

The back sheet 50 prevents moisture or oxygen from penetrating into a back surface of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In a double-sided light receiving solar cell, a glass or a resin having a light transparency may be used instead of the back sheet 50.

The front and back protective layers 30a and 30b and the solar cells 10 form an integral body when a lamination process is performed in a state where the front and back protective layers 30a and 30b are respectively positioned on front surfaces and back surfaces of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used.

The transparent member 40 on the front protective layer 30a is formed of a tempered glass having a high light transmittance and excellent damage prevention characteristic. The tempered glass may be a low iron tempered glass containing a small amount of iron. The transparent member 40 may have an embossed inner surface so as to increase a scattering effect of light.

As shown in FIG. 1, the plurality of solar cells 10 is arranged in a matrix structure. Although FIG. 1 illustrates the solar cells 10 on the back protective layer 30b having a structure of a 3×3 matrix, the number of solar cells 10 in row and/or column directions may vary, if necessary or desired.

Figure 2:
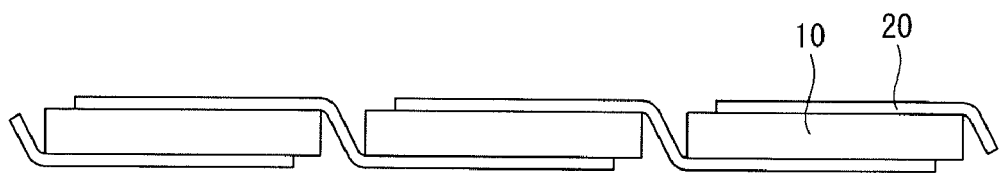
FIG. 2 schematically illustrates an electrical connection structure between a plurality of solar cells of the solar cell panel shown in FIG. 1.

As shown in FIG. 2, the plurality of solar cells 10 are electrically connected to one another using the interconnectors 20.

More specifically, an electrode part formed on a front surface of one solar cell 10 is electrically connected to an electrode part formed on a back surface of another solar cell 10 adjacent to the one solar cell 10 using an interconnector 20 in a state where the plurality of solar cells 10 are positioned adjacently to one another.

Figure 3:
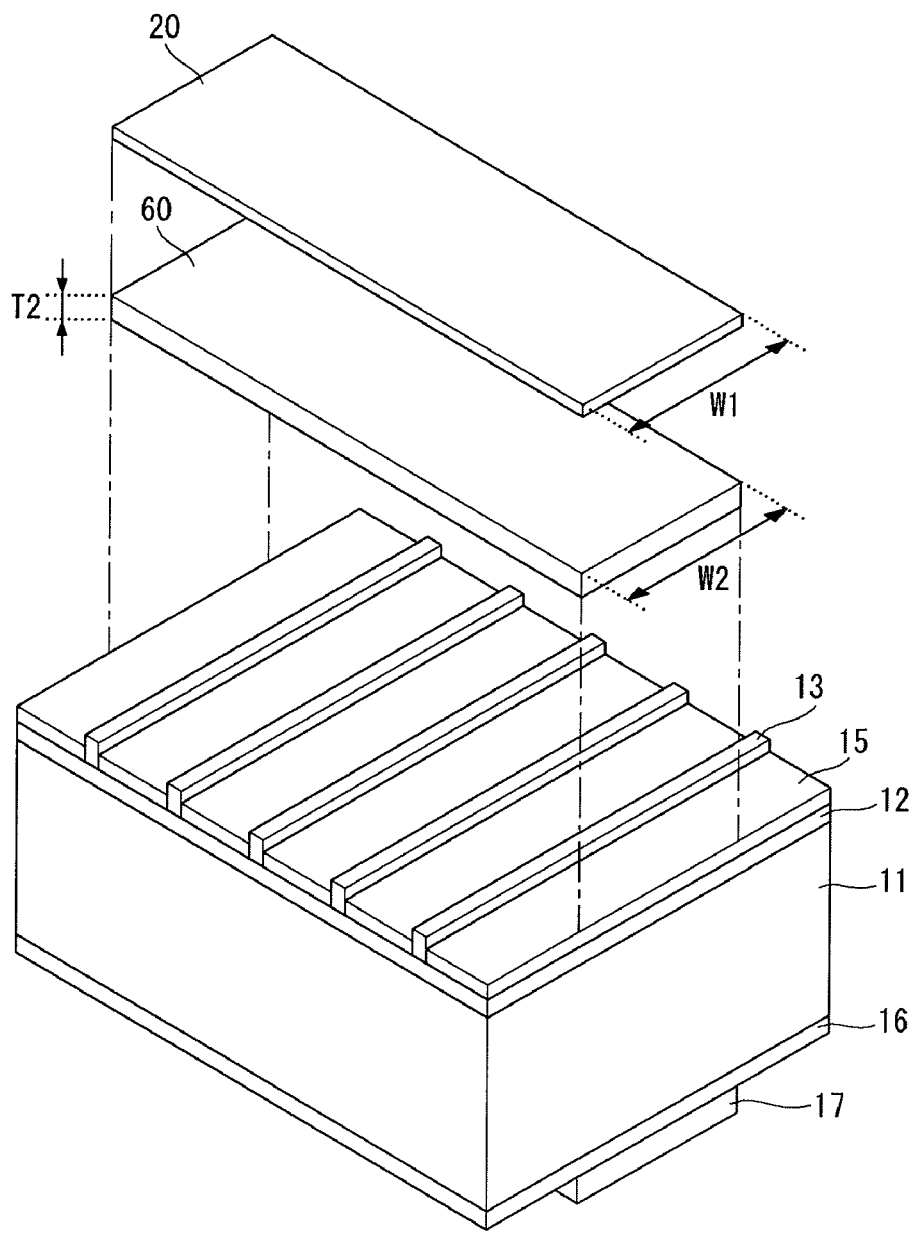
FIG. 3 is an exploded perspective view illustrating a first example configuration of a solar cell in the solar cell panel shown in FIG. 1.
Figure 4:
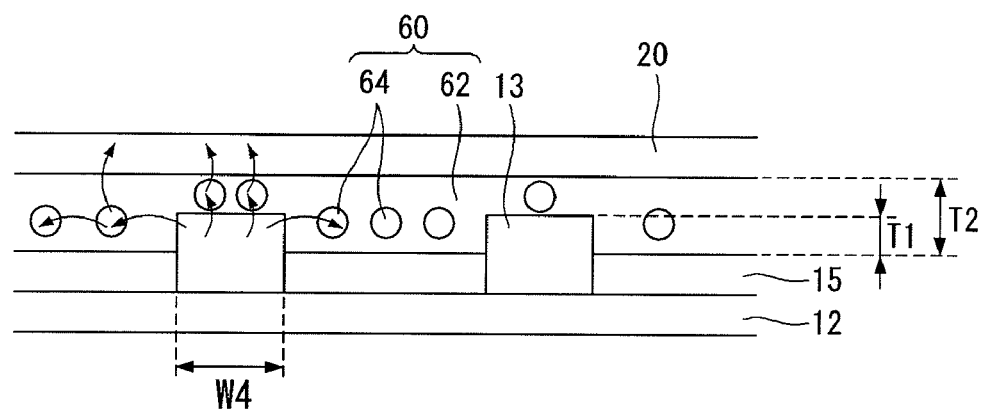
FIGS. 4 to 6 are cross-sectional views illustrating various assembly configurations of the solar cell in the solar cell panel shown in FIG. 3.
Figure 5:
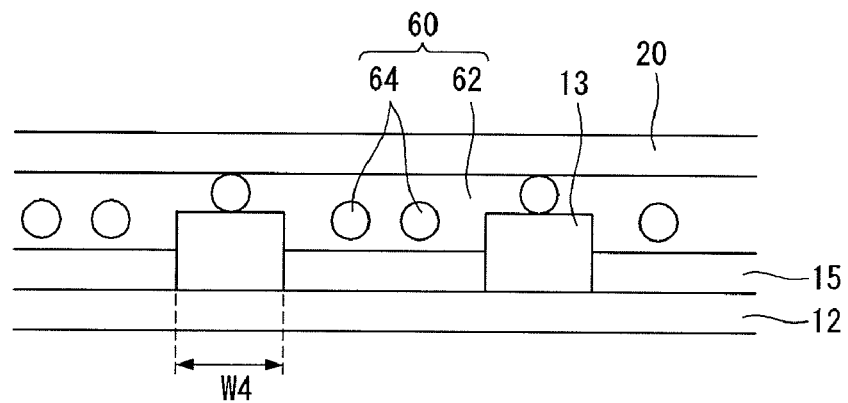
Figure 6:
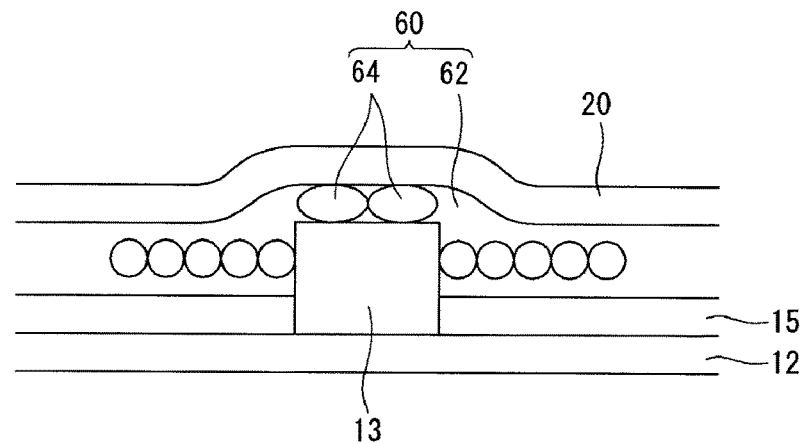

FIG. 3 is an exploded perspective view illustrating a first example configuration of a solar cell in the solar cell panel shown in FIG. 1. FIGS. 4 to 6 are cross-sectional views illustrating various assembly configurations of the solar cell in the solar cell panel shown in FIG. 3.

As shown in FIG. 3, the solar cell 10 includes a substrate 11, an emitter layer 12 positioned at a front surface (for example, a light receiving surface on which light is incident) of the substrate 11, a plurality of front electrodes 13 positioned on the emitter layer 12, an anti-reflection layer 15 positioned on the emitter layer 12 on which the plurality of front electrodes 13 are not positioned, a back electrode 16 positioned on a surface opposite the light receiving surface of the substrate 11, and a back electrode current collector 17 positioned on a back surface of the back electrode 16.

The solar cell 10 may further include a back surface field (BSF) layer between the back electrode 16 and the substrate 11. The back surface field layer is a region (e.g., a $p^+$-type region) that is more heavily doped with impurities of the same conductive type as the substrate 11 than the substrate 11. The back surface field layer serves as a potential barrier of the substrate 11. Thus, because a recombination and/or a disappearance of electrons and holes around the back surface of the substrate 11 are prevented or reduced, the efficiency of the solar cell 10 is improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics having a plurality of uneven portions. When the surface of the substrate 11 is the textured surface, a light reflectance at the light receiving surface of the substrate 11 is reduced. Further, because both a light incident operation and a light reflection operation are performed on the textured surface of the substrate 11, light is confined in the solar cell 10. Hence, a light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy produced by light incident on the substrate 11 is applied to electron-hole pairs inside the semiconductors of the substrate 11, electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the p-type substrate 11 and holes move to the n-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 15 on the emitter layer 12 may be formed of silicon nitride (SiNx), silicon dioxide ($SiO_2$), or titanium dioxide ($TiO_2$). The anti-reflection layer 15 reduces a reflectance of light incident on the solar cell 10 and increases a selectivity of a predetermined wavelength band of the incident light, thereby increasing the efficiency of the solar cell 10. The anti-reflection layer 15 may have a thickness of about 70 nm to 80 nm. The anti-reflection layer 15 may be omitted, if desired.

The plurality of front electrodes 13 on the emitter layer 12 are electrically and physically connected to the emitter layer 12 and are formed in one direction in a state where the adjacent front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of an Ag paste containing lead (Pb). In this instance, the front electrodes 13 may be electrically connected to the emitter layer 12 by way of a process in which the Ag paste is coated on the anti-reflection layer 15 using a screen printing method and the substrate 11 is fired at a temperature of about 750° C. to 800° C. The electrical connection between the front electrodes 13 and the emitter layer 12 is performed by etching the anti-reflection layer 15 using the lead (Pb) contained in the Ag paste during the firing process and which then brings Ag particles of the Ag paste into contact with the emitter layer 12.

The back electrode 16 is formed on the surface (i.e., the back surface of the substrate 11) opposite the light receiving surface of the substrate 11. The back electrode 16 collects carriers (e.g., holes) moving to the substrate 11. The back electrode 16 is formed of at least one conductive material. The conductive material may be at least one selected from the group consisting of Ni, Cu, Ag, Al, Sn, Zn, In, Ti, Au, and a combination thereof. Other conductive materials may be used for the back electrode 16.

The back electrode current collector 17 is positioned under the back electrode 16 in a direction crossing the front electrodes 13 and is electrically connected to the back electrode 16. Thus, the back electrode current collector 17 outputs the carriers (e.g., holes) transferred from the back electrode 16 to an external device. The back electrode current collector 17 is formed of at least one conductive material. The conductive material may be at least one selected from the group consisting of Ni, Cu, Ag, Al, Sn, Zn, In, Ti, Au, and a combination thereof. Other conductive materials may be used for the back electrode current collector 17.

As shown in FIG. 2, the solar cells 10 each having the above-described configuration are electrically connected to one another using the interconnector 20.

More specifically, a plurality of conductive adhesive films 60 are formed on the emitter layer 12 in direction crossing the front electrodes 13, and the interconnector 20 is positioned on the conductive adhesive films 60. A width W1 of the interconnector 20 is substantially equal to a width W2 of the conductive adhesive film 60.

Although FIG. 3 shows only one conductive adhesive film 60, two or three conductive adhesive films 60 may be positioned on the front surface of the substrate 11. The number of conductive adhesive films 60 that may be used is not limited.

The conductive adhesive film 60 includes a resin 62 and conductive particles 64 dispersed in the resin 62. A material of the resin 62 is not particularly limited as long as it has the adhesive property. It is preferable, but not required, that a thermosetting resin is used for the resin 62 so as to increase an adhesive reliability. The thermosetting resin may use or include at least one selected among epoxy resin, phenoxy resin, acryl resin, polyimide resin, and polycarbonate resin.

The front electrodes 13 and the back electrode current collector 17 serve as a binder and may include a resin formed of the same material as the resin 62.

The resin 62 may further contain a predetermined material, for example, a known curing agent and a known curing accelerator other than the thermosetting resin.

For example, the resin 62 may contain a reforming material such as a silane-based coupling agent, a titanate-based coupling agent, and an aluminate-based coupling agent, so as to improve an adhesive strength between the front electrodes 13 and the interconnector 20. The resin 62 may contain a dispersing agent such as calcium phosphate and calcium carbonate, so as to improve the dispersibility of the conductive particles 64. The resin 62 may contain a rubber component such as acrylic rubber, silicon rubber, and urethane rubber, so as to control the modulus of elasticity of the resin 62.

A material of the conductive particles 64 is not particularly limited as long as it has the conductivity. The conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles 64 need not be formed of only metal particles or metal-coated resin particles. The conductive adhesive film 60 having the above-described configuration may include a peeling film.

It is preferable, but not required, that the conductive particles 64 use the metal-coated resin particles, so as to mitigate a compressive stress on the conductive particles 64 and improve a connection reliability of the conductive particles 64. It is preferable, but not required, that the conductive particles 64 have a diameter of 2 μm to 30 μm, so as to improve the dispersibility of the conductive particles 64.

It is preferable, but not required, that a composition amount of the conductive particles 64 dispersed in the resin 62 is 0.5% to 20% based on the total volume of the conductive adhesive film 60 in consideration of the connection reliability after the resin 62 is cured.

When the composition amount of the conductive particles 64 is less than 0.5%, a current may not smoothly flow in the front electrodes 13 because a physical contact area between the front electrodes 13 and the conductive adhesive film 60 decreases. When the composition amount of the conductive particles 64 is greater than 20%, the adhesive strength between the front electrodes 13 and the interconnector 20 may be reduced because a composition amount of the resin 62 relatively decreases.

The conductive adhesive film 60 is attached to a portion of each front electrode 13 in the direction crossing the front electrodes 13. Thus, a portion of the conductive adhesive film 60 directly contacts the portion of each front electrode 13, and a remaining portion of the conductive adhesive film 60 directly contacts the anti-reflection layer 15.

When a tabbing process is performed using the conductive adhesive film 60, a heating temperature and a pressure are not particularly limited as long as they are within the range capable of securing an electrical connection and maintaining the adhesive strength.

For example, the heating temperature may be set to a temperature capable of curing the resin 62, for example, 140° C. to 180° C. The pressure may be set to a range capable of sufficiently attaching the front electrodes 13, the conductive adhesive film 60, and the interconnector 20 to one another. Further, a heating and pressure time may be set to the extent that the front electrodes 13, the interconnector 20, etc., are not damaged or deteriorated because of heat.

Each front electrode 13 includes a first portion 13a attached to the conductive adhesive film 60 and a second portion 13b not attached to the conductive adhesive film 60.

A portion of the interconnector 20 is attached to a front surface of the conductive adhesive film 60 attached to the first portion 13a of the front electrode 13 in the same direction as a formation direction of the conductive adhesive film 60. A remaining portion (or an opposite end) of the interconnector 20 not attached to the conductive adhesive film 60 is attached to the back electrode current collector 17 of the adjacent solar cell 10.

In an embodiment, the conductive adhesive film 60 is positioned between the plurality of front electrodes 13 and the interconnector 20 without an intervening layer. Accordingly, the conductive adhesive film 60 is directly attached to (or in contact with) the plurality of front electrodes 13 and the interconnector 20.

As shown in FIG. 4, the resin 62 may be positioned between the conductive particles 64 and the front electrode 13, and between the conductive particles 64 and the interconnector 20 in a state where the front electrode 13 is attached to the interconnector 20 using the conductive adhesive film 60.

In this instance, carriers moving to the front electrode 13 jump to the conductive particles 64 and then again jump to the interconnector 20. Further, carriers jumping to the conductive particles 64 may jump to the adjacent conductive particles 64. Thus, the carriers moving to the front electrode 13 move to the interconnector 20 as indicated by an arrow shown in FIG. 4.

A distance between the conductive particles 64 may be properly set so that carriers can jump between the adjacent conductive particles 64. The distance between the conductive particles 64 may be set by properly adjusting the number or the size of the conductive particles 64 dispersed in the resin 62.

Thus, the carriers moving to the front electrode 13 are transferred to the interconnector 20 through the conductive particles 64.

Alternatively, as shown in FIG. 5, the conductive particles 64 may directly contact one or both of the front electrode 13 and the interconnector 20 and/or to one other. In the structure shown in FIG. 5, because the carriers moving to the front electrode 13 are directly transferred to the interconnector 20 through the conductive particles 64, a current in the structure shown in FIG. 5 more smoothly flows than the structure shown in FIG. 4.

A remaining portion of the conductive adhesive film 60 not attached to the first portion 13a of the front electrode 13 directly contacts the anti-reflection layer 15 on the emitter layer 12.

The conductive adhesive film 60 may have a thickness T2 greater than a protruding thickness T1 of the front electrode 13, so that the conductive adhesive film 60 and the interconnector 20 are sufficiently attached to each other. In this instance, because the front surface of the conductive adhesive film 60 is a flat surface, the conductive adhesive film 60 and the interconnector 20 are sufficiently attached to each other.

Because a thickness of the front electrode 13 is generally equal to or less than about 15 μm, the protruding thickness T1 of the front electrode 13 is less than about 15 μm. Thus, the thickness T2 of the conductive adhesive film 60 may be about 15 μm to 60 μm based on specifications of the solar cell to apply to the solar cell panel.

As another example, as shown in FIG. 6, the conductive adhesive film 60 may have a height difference. Further, the adjacent conductive particles 64 may physically contact one another so that carriers moving to the front electrode 13 are satisfactorily transferred to the interconnector 20. At least two conductive particles may be positioned on each front electrode 13.

When the conductive adhesive film 60 has the height difference, the interconnector 20 may have the same height difference as the conductive adhesive film 60. The interconnector 20 may have a portion, whose the surface protrudes, because of the conductive particles 64.

As shown in FIG. 6, the conductive particles 64 may be modified into an oval shape because of the pressure applied during the tabbing process. In this instance, it is preferable, but not required, that the width W2 of the conductive adhesive film 60 is greater than the thickness T2 of the conductive adhesive film 60.

A width W4 of the first portion 13a of the front electrode 13 may be substantially equal to a width W5 of the second portion 13b of the front electrode 13. Alternatively, the width W4 of the first portion 13a of the front electrode 13 may be different from the width W5 of the second portion 13b of the front electrode 13.

Figure 7:
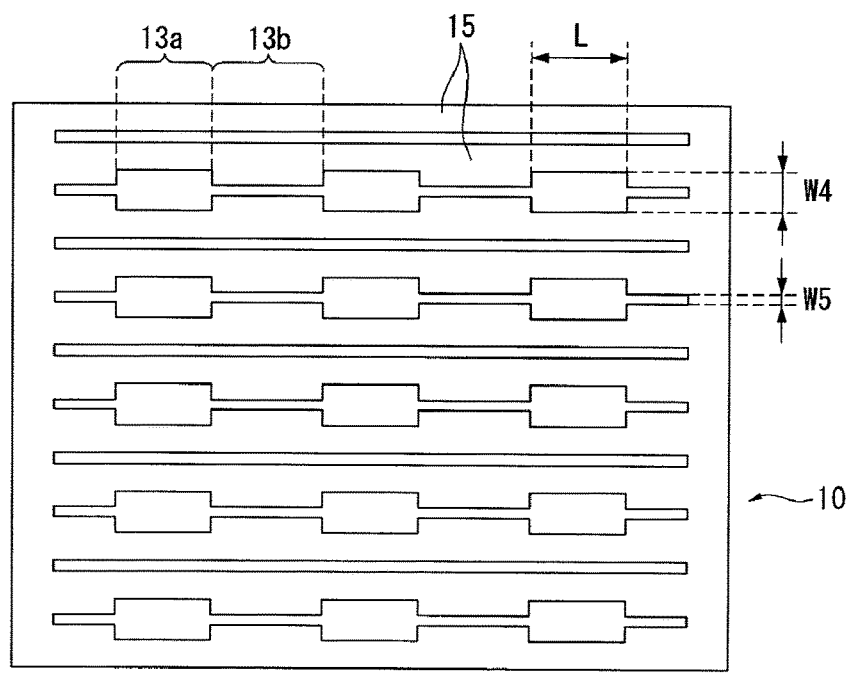
FIGS. 7 and 8 are plane views of a front surface of a substrate illustrating various configurations of a front electrode.

As shown in FIG. 7, the width W4 of the first portion 13a of the front electrode 13 may be greater than the width W5 of the second portion 13b of the front electrode 13. When the width W4 of the first portion 13a is greater than the width W5 of the second portion 13b, the adhesive strength between the conductive adhesive film 60 and the front electrode 13 is improved, and a contact resistance between the conductive adhesive film 60 and the front electrode 13 decreases. Hence, an output reduction thereof may be prevented or reduced.

The first portion 13a having the width W4 greater than the width W5 of the second portion 13b is formed in only the front electrodes 13 positioned on predetermined rows, and the first portion 13a having the same width as the second portion 13b is formed in the front electrodes 13 positioned on remaining rows. For example as shown in FIG. 7, each of the front electrodes 13 positioned on even-numbered rows includes the first portion 13a having the width W4 greater than the width W5 of the second portion 13b, and each of the front electrodes 13 positioned on odd-numbered rows includes the first portion 13a having the same width as the second portion 13b.

The first portion 13a having the width W4 greater than the width W5 of the second portion 13b may be formed for only the front electrodes 13 positioned on the odd-numbered rows, and/or may have various shapes other than the shape shown in FIG. 7. For example, the various shapes may include a triangle or a semicircle.

The first portion 13a is formed in an up-down symmetric manner based on the front electrode 13 and has a predetermined length L in a longitudinal direction of the front electrode 13. It is preferable, but not required, that the predetermined length L of the first portion 13a is set based on the width W1 of the interconnector 20 and the width W2 of the conductive adhesive film 60, so as to improve the adhesive strength between the conductive adhesive film 60 and the front electrodes 13, and reduce the contact resistance between the conductive adhesive film 60 and the front electrodes 13.

In the example embodiment of the invention, because the width W1 of the interconnector 20 is substantially equal to the width W2 of the conductive adhesive film 60, the length L of the first portion 13a may be equal to or less than the width W2 of the conductive adhesive film 60.

It is preferable, but not required, that the length L of the first portion 13a is equal to or less than about 2 mm so as to prevent or reduce a reduction in a light receiving area of the solar cell panel.

When the width W2 of the conductive adhesive film 60 is less than about 1 mm, the contact resistance increases. When the width W2 of the conductive adhesive film 60 is greater than about 20 mm, the light receiving area decreases. Thus, the width W2 of the conductive adhesive film 60 may be about 1 mm to 20 mm in consideration of the length L of the first portion 13a.

Figure 8:
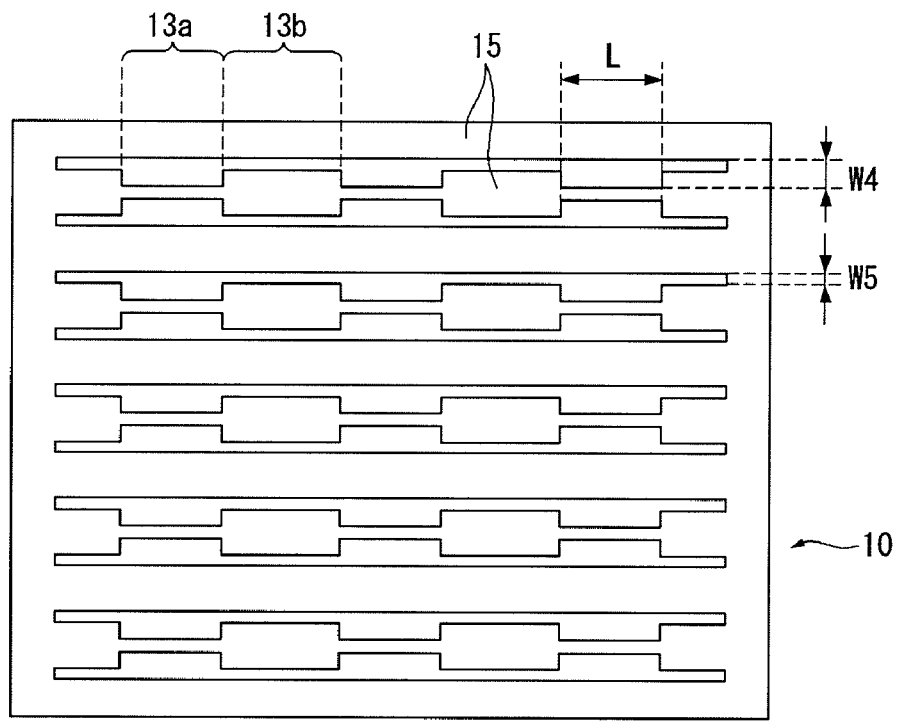

Alternatively, as shown in FIG. 8, each of the front electrodes 13 positioned on all of the rows may include the first portion 13a having the width W4 greater than the width W5 of the second portion 13b.

The adjacent first portions 13a may protrude opposite each other. The adjacent first portions 13a may protrude in the same direction.

So far, the example embodiment of the invention described the instance where the width W1 of the interconnector 20 is substantially equal to the width W2 of the conductive adhesive film 60 as an example.

Figure 9:
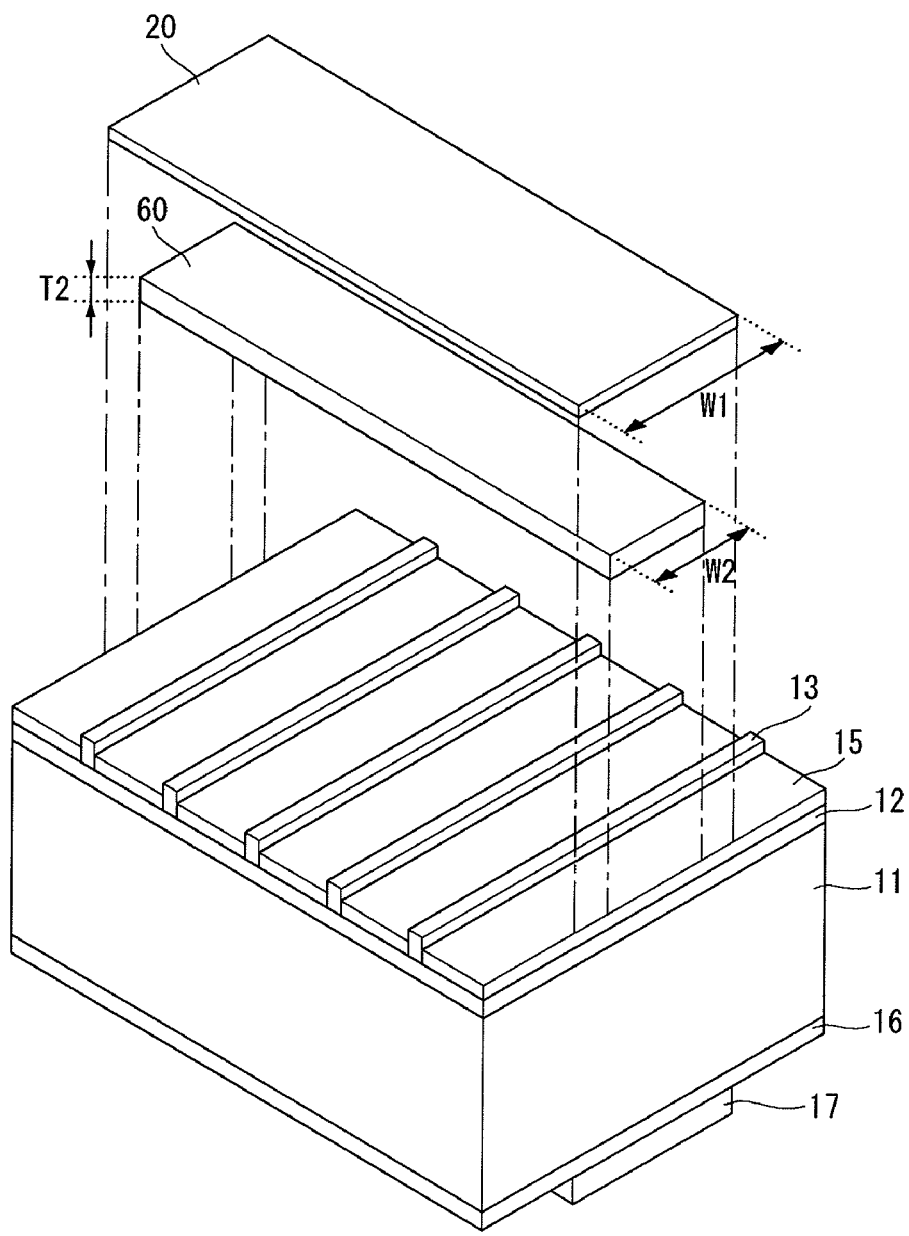
FIG. 9 is an exploded perspective view illustrating a second example configuration of a solar cell in the solar cell panel shown in FIG. 1.
Figure 10:
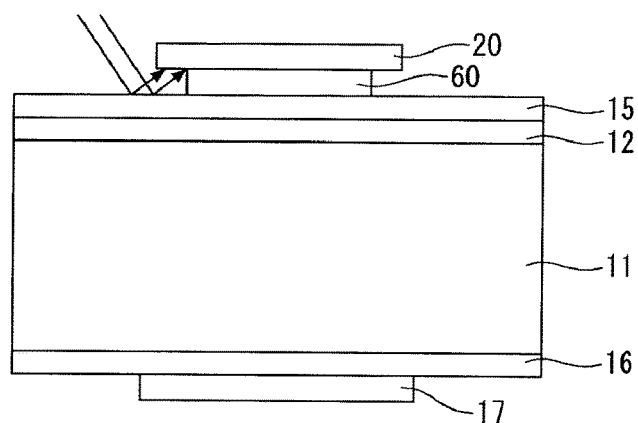
FIG. 10 is a cross-sectional view illustrating an assembly configuration of the solar cell in the solar cell panel shown in FIG. 9.

On the other hand, as shown in FIGS. 9 and 10, in a second example configuration of the solar cell in the solar cell panel shown in FIG. 2, the width W1 of the interconnector 20 may be greater than the width W2 of the conductive adhesive film 60. The width W1 of the interconnector 20 may be equal to or less than about 1.5 times the width W2 of the conductive adhesive film 60.

In the second example configuration shown in FIGS. 9 and 10, a portion of light, that is incident on the light receiving surface of the substrate 10 and then reflected from the light receiving surface, is reflected from a lower surface of the interconnector 20 and then is again incident on the light receiving surface of the substrate 10 as indicated by an arrow shown in FIG. 10. Hence, the light absorptance increases.

A third example configuration of the solar cell in the solar cell panel shown in FIG. 2 is described below in detail with reference to FIGS. 11 to 16.

In the third example configuration of the solar cell in the solar cell panel, at least two front electrode current collectors 14 are formed on the emitter layer 12 in the direction crossing the front electrodes 13.

The front electrode current collectors 14 are formed of at least one conductive material. The conductive material used for the front electrode current collectors 14 may be at least one selected from the group consisting of Ni, Cu, Ag, Al, Sn, Zn, In, Ti, Au, and a combination thereof. Other conductive materials may be used. The front electrode current collectors 14 are electrically and physically connected to the emitter layer 12 and the front electrodes 13. Thus, the front electrode current collectors 14 output carriers (e.g., electrons) transferred from the front electrodes 13 to the external device.

The front electrodes 13 and the front electrode current collectors 14 may be electrically connected to the emitter layer 12 through a punch through operation by way of a process in which the conductive material is applied on the anti-reflection layer 15, patterned, and fired.

In the solar cell panel shown in FIGS. 11 to 16, the conductive adhesive film 60 is positioned not on the front electrode 13 but on the front electrode current collectors 14.

Figure 11:
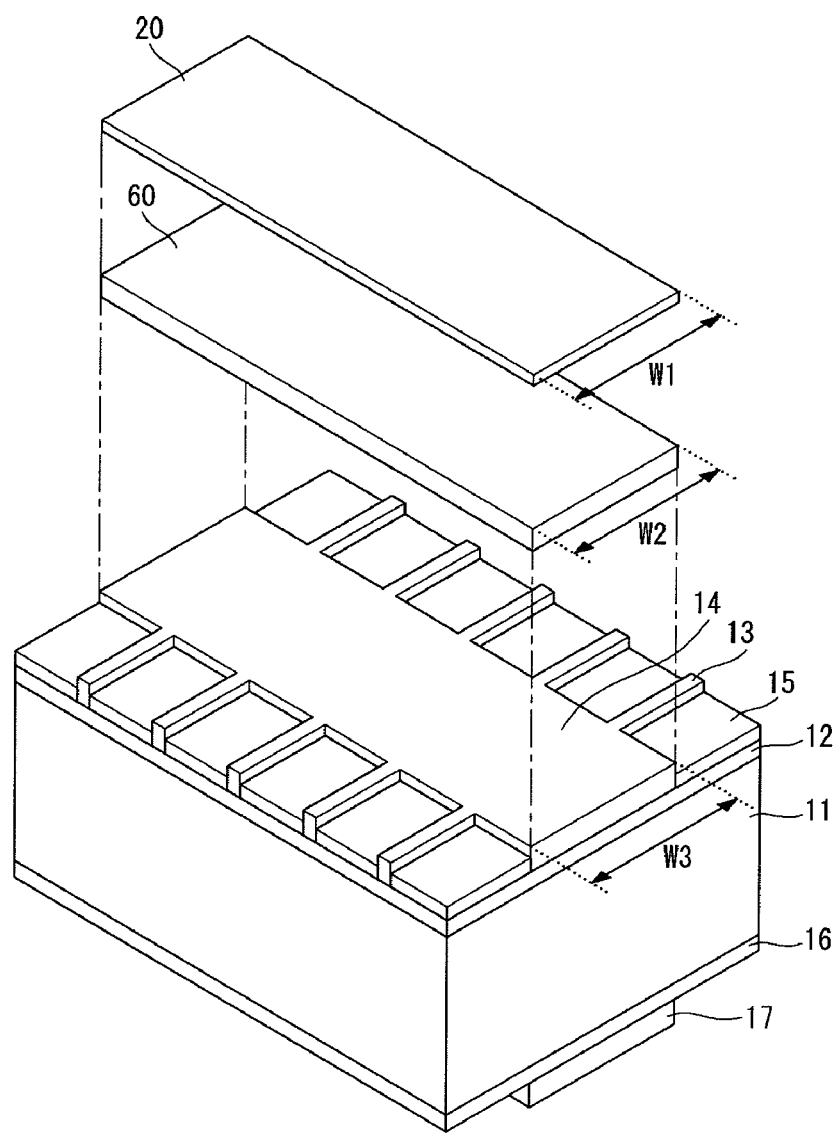
FIG. 11 is an exploded perspective view illustrating a third example configuration of a solar cell in the solar cell panel shown in FIG. 1.
Figure 12:
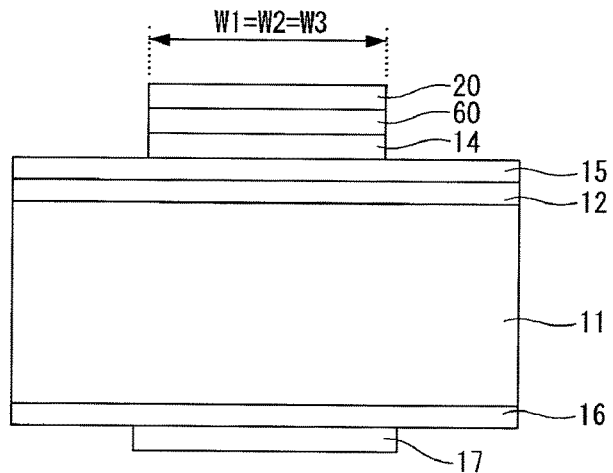
FIGS. 12 to 16 are cross-sectional views illustrating various assembly configurations of the solar cell in the solar cell panel shown in FIG. 11.

As shown in FIGS. 11 and 12, the width W1 of the interconnector 20, the width W2 of the conductive adhesive film 60, and a width W3 of the front electrode current collector 14 may be substantially equal to one another. The width W3 of the front electrode current collector 14 is equal to or less than about 2.0 mm.

Figure 13:
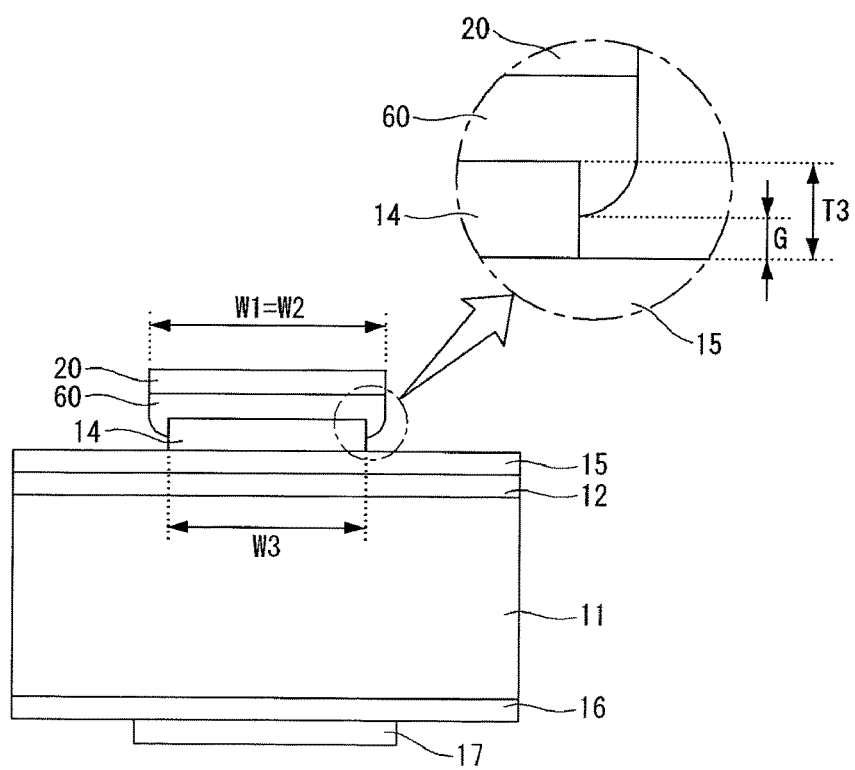

Further, as shown in FIG. 13, the width W1 of the interconnector 20 and the width W2 of the conductive adhesive film 60 may be substantially equal to each other, and the widths W1 and W2 may be greater than the width W3 of the front electrode current collector 14.

In this instance, the widths W1 and W2 are equal to or less than about 1.5 times the width W3. A portion of the conductive adhesive film 60 is attached to a portion of a side surface of the front electrode current collector 14 at a predetermined distance G from the surface of the substrate 11, i.e., the surface of the anti-reflection layer 15. The predetermined distance G is equal to or greater than about 0.1 times a thickness T3 of the front electrode current collector 14. The width W3 of the front electrode current collector 14 is equal to or less than about 2.0 mm. In other embodiments, it is possible that the predetermined distance G may be zero, so that a portion of the conductive adhesive film 60 contacts the surface of the anti-reflection layer 15.

Figure 14:
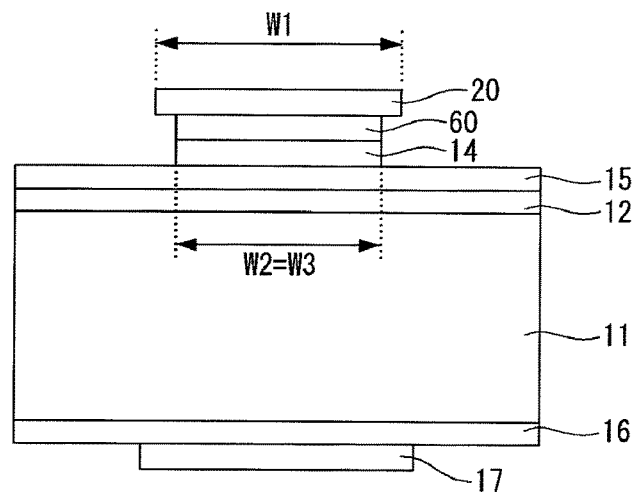

Further, as shown in FIG. 14, the width W1 of the interconnector 20 may be greater than the width W2 of the conductive adhesive film 60, and the width W2 may be substantially equal to the width W3 of the front electrode current collector 14. In this instance, the width W1 is equal to or less than about 1.5 times the widths W2 and W3 and the width W3 of the front electrode current collector 14 is equal to or less than about 2.0 mm.

Figure 15:
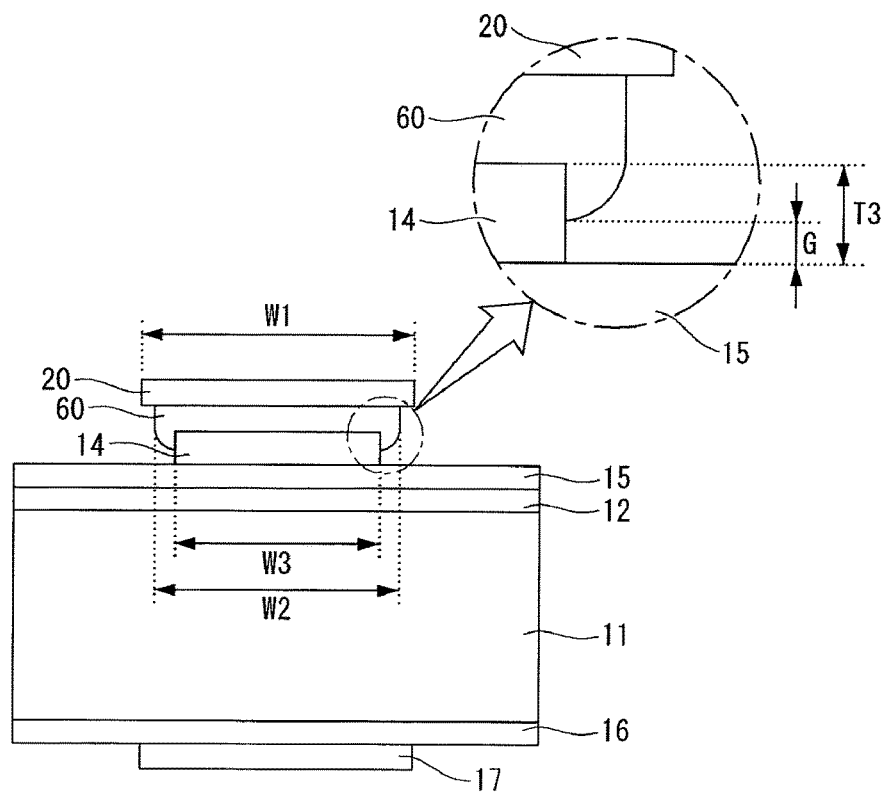

Further, as shown in FIG. 15, the width W1 of the interconnector 20 may be greater than the width W2 of the conductive adhesive film 60, and the width W2 may be greater than the width W3 of the front electrode current collector 14.

In this instance, the width W1 is equal to or less than about 1.5 times the widths W2 and W3. A portion of the conductive adhesive film 60 is attached to a portion of a side surface of the front electrode current collector 14 at a predetermined distance G from the surface of the substrate 11, i.e., the surface of the anti-reflection layer 15. The predetermined distance G is equal to or greater than about 0.1 times a thickness T3 of the front electrode current collector 14. The width W3 of the front electrode current collector 14 is equal to or less than about 2.0 mm. In other embodiments, it is possible that the predetermined distance G may be zero, so that a portion of the conductive adhesive film 60 contacts the surface of the anti-reflection layer 15.

Figure 16:
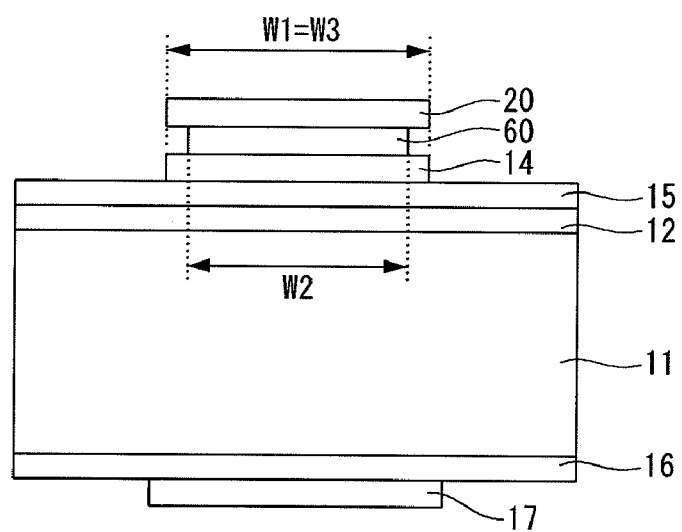

Further, as shown in FIG. 16, the width W1 of the interconnector 20 may be equal to the width W3 of the front electrode current collector 14, and the widths W1 and W3 may be greater than the width W2 of the conductive adhesive film 60. In this instance, the widths W1 and W3 are 1.5 times equal to or less than the width W2, and the width W3 of the front electrode current collector 14 is equal to or less than 2.0 mm.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel, comprising:
   a plurality of solar cells each including a substrate and a plurality of front electrodes positioned on a surface of the substrate, the plurality of solar cells extending in a first direction;
   an interconnector extending in the first direction and configured to electrically connect one of the plurality of solar cells to another of the plurality of solar cells; and
   a conductive layer including a resin and a plurality of conductive particles dispersed in the resin, the conductive layer being positioned in the first direction and positioned between the plurality of front electrodes of the one of the plurality of solar cells and the interconnector to electrically connect the plurality of front electrodes of the one of the plurality of solar cells to the interconnector,
   wherein the plurality of front electrodes includes:
      at least one first front electrode extending in a second direction crossing the first direction, each of the at least one first front electrode including at least one first portion having a first width in the first direction and a second portion having a second width smaller than the first width in the first direction, and
      at least one second front electrode extending in the second direction, each of the at least one second front electrode including only a third portion having a third width in the first direction, wherein the third width is equal to the second width, and
   wherein one of the at least one first portion of the at least one first front electrode and one of the third portion of the at least one second front electrode are disposed at an overlap area of the interconnector and the plurality of front electrodes, and are spaced apart from each other and parallel to each other.

2. The solar cell panel of claim 1, wherein each of the at least one first portion of the at least one first front electrode has a fourth width in the second direction, and
   wherein a width of the interconnector in the second direction is equal to or greater than the fourth width of each of the at least one first portion.

3. The solar cell panel of claim 2, wherein the width of the interconnector, the width of the conductive layer, and the fourth width of the each of the at least one first portion are substantially equal to one another.

4. The solar cell panel of claim 2, wherein the width of the interconnector is substantially equal to the width of the conductive layer, and the width of the conductive layer is greater than the fourth width of the each of the at least one first portion.

5. The solar cell panel of claim 4, wherein the width of the interconnector and the width of the conductive layer are equal to or less than about 1.5 times the fourth width of the each of the at least one first portion.

6. The solar cell panel of claim 5, wherein a portion of the conductive layer is attached to a portion of a side surface of the each of the at least one first portion at a predetermined distance from the surface of the substrate.

7. The solar cell panel of claim 6, wherein the portion of the conductive layer that is disposed on the portion of the side surface of the at least one first portion overhangs a portion of the front surface of an anti-reflection layer positioned on an emitter layer on which the plurality of front electrodes are not positioned.

8. The solar cell panel of claim 2, wherein the width of the interconnector is greater than the width of the conductive layer, and the width of the conductive layer is substantially equal to the fourth width of the each of the at least one first portion.

9. The solar cell panel of claim 8, wherein the width of the interconnector is equal to or less than about 1.5 times the width of the conductive layer and the fourth width of the each of the at least one first portion.

10. The solar cell panel of claim 2, wherein the width of the interconnector is greater than the width of the conductive layer, and the width of the conductive layer is greater than the width of the fourth width of the each of the at least one first portion.

11. The solar cell panel of claim 10, wherein the width of the interconnector is equal to or less than about 1.5 times the width of the conductive layer and the third width of the each of the at least one first portion.

12. The solar cell panel of claim 11, wherein a portion of the conductive layer is attached to a portion of a side surface of the each of the at least one first portion at a predetermined distance from the surface of the substrate.

13. The solar cell panel of claim 12, wherein the portion of the conductive layer that is disposed on the portion of the side surface of the each of the at least one first portion overhangs a portion of the front surface of an anti-reflection layer positioned on an emitter layer on which the plurality of front electrodes are not positioned.

14. The solar cell panel of claim 2, wherein the width of the interconnector is substantially equal to the fourth width of the each of the at least one first portion and the width of the interconnector, and the fourth width of the each of the at least one first portion is greater than the width of the conductive layer.

15. The solar cell panel of claim 14, wherein the width of the interconnector and the fourth width of the each of the at least one first portion are equal to or less than about 1.5 times the width of the conductive layer.

16. The solar cell panel of claim 1, wherein a portion of the conductive layer that is disposed on a portion of a side surface of the each of the at least one first portion overhangs a portion of the front surface of an anti-reflection layer positioned on an emitter layer on which the plurality of front electrodes are not positioned.

17. The solar cell panel of claim 16, wherein a portion of the conductive layer directly contacts the anti-reflection layer in an area on which the at least one second portion is positioned.

18. A solar cell panel, comprising:
  a plurality of solar cells each including a substrate and a plurality of front electrodes positioned on a surface of the substrate;
  an interconnector extending in a first direction crossing the plurality of front' electrodes and configured to electrically connect at least one of the plurality of solar cells to another of the plurality of solar cells; and
  a conductive adhesive film including a resin and a plurality of conductive particles dispersed in the resin, the conductive adhesive film being positioned in the first direction and positioned between the plurality of front electrodes of the at least one of the plurality of solar cells and the interconnector to electrically connect the plurality of front electrodes of the at least one of the plurality of solar cells to the interconnector,
wherein at least one of the plurality of front electrodes includes at least one first portion having a first width in the first direction and a second width in a second direction crossing the first direction and at least one second portion having a first width in the first direction,
wherein each of the at least one first portion is positioned at an overlap area of the interconnector and the at least one of the plurality of front electrodes,
wherein the first width of the at least one first portion is larger than the first width of the at least one second portion,
wherein a width of the interconnector in the second direction is equal to or greater than a width of the conductive adhesive film in the second direction, and
wherein a portion of the conductive adhesive film that is disposed on a portion of a side surface of the each of the at least one first portion overhangs a portion of the front surface of an anti-reflection layer positioned on an emitter layer on which the plurality of front electrodes are not positioned.

\* \* \* \* \*